(12) United States Patent
Marutani et al.

(10) Patent No.: US 8,786,110 B2
(45) Date of Patent: Jul. 22, 2014

(54) SEMICONDUCTOR DEVICE AND MANUFACTURING METHOD THEREOF

(75) Inventors: Hisakazu Marutani, Kanagawa (JP);
Yasunari Iwami, Kanagawa (JP);
Tomoshige Chikai, Kanagawa (JP);
Tomoko Takahashi, Kanagawa (JP);
Osamu Yamagata, Kanagawa (JP);
Shingo Mitsugi, Kanagawa (JP);
Chunghao Chen, Kanagawa (JP)

(73) Assignee: J-Devices Corporation, Usuki (JP)

( * ) Notice: Subject to any disclaimer, the term of this patent is extended or adjusted under 35 U.S.C. 154(b) by 181 days.

(21) Appl. No.: 13/075,921

(22) Filed: Mar. 30, 2011

(65) Prior Publication Data

US 2012/0074594 A1    Mar. 29, 2012

(30) Foreign Application Priority Data

Sep. 24, 2010 (JP) ................................ 2010-214306

(51) Int. Cl.
*H01L 23/48* (2006.01)
*H01L 23/02* (2006.01)

(52) U.S. Cl.
USPC ..... 257/787; 257/774; 257/686; 257/E23.145

(58) Field of Classification Search
USPC .......................... 257/686, 774, 787, E23.145
See application file for complete search history.

(56) References Cited

U.S. PATENT DOCUMENTS 5,111,278 A * 5/1992 Eichelberger ................. 257/698
5,353,498 A * 10/1994 Fillion et al. ................... 29/840
5,497,033 A * 3/1996 Fillion et al. ................... 257/723
5,870,289 A * 2/1999 Tokuda et al. ................. 361/779
5,883,426 A    3/1999 Tokuno et al.
6,271,469 B1 * 8/2001 Ma et al. ........................ 174/521
6,506,632 B1 * 1/2003 Cheng et al. ................... 438/126
6,555,906 B2 * 4/2003 Towle et al. ................... 257/723
7,294,922 B2   11/2007 Jobetto et al.
2001/0030059 A1 * 10/2001 Sugaya et al. ................. 174/256
2002/0195701 A1   12/2002 Bemmerl et al.
2003/0109072 A1    6/2003 Meyer et al.
2003/0141105 A1 * 7/2003 Sugaya et al. ................. 174/256

(Continued)

FOREIGN PATENT DOCUMENTS

JP    05-259208    10/1993
JP    08-111495    4/1996

(Continued)

OTHER PUBLICATIONS

Japanese Notification of Reasons for Refusal mailed Jan. 22, 2013 in Japanese Patent Application No. 2010-214306.

(Continued)

*Primary Examiner* — Nitin Parekh
(74) *Attorney, Agent, or Firm* — Staas and Halsey LLP

(57) ABSTRACT

A semiconductor device comprising a support plate, a semiconductor element mounted on the support plate and including a circuit element surface having a plurality of first electrodes, a first insulation layer covering the circuit element surface of the semiconductor element, and including a plurality of first apertures exposing the plurality of first electrodes, a second insulation layer covering an upper part of the support plate and side parts of the semiconductor element, and wirings formed on an upper part of the first insulation layer and on an upper part of the second insulation layer, and electrically connected to the corresponding first electrodes.

8 Claims, 8 Drawing Sheets

(56) References Cited

U.S. PATENT DOCUMENTS

| | | |
|---|---|---|
| 2003/0178747 A1 | 9/2003 | Bast et al. |
| 2004/0041251 A1 | 3/2004 | Goller et al. |
| 2004/0126910 A1 | 7/2004 | Thomas et al. |
| 2004/0140559 A1 | 7/2004 | Goller et al. |
| 2004/0232543 A1 | 11/2004 | Goller et al. |
| 2005/0014309 A1 | 1/2005 | Hedler et al. |
| 2005/0017374 A1 | 1/2005 | Kiendl et al. |
| 2005/0087851 A1 | 4/2005 | Fuergut et al. |
| 2005/0124093 A1 | 6/2005 | Yang et al. |
| 2005/0151246 A1 | 7/2005 | Daeche et al. |
| 2005/0184375 A1 | 8/2005 | Goller et al. |
| 2005/0236696 A1 | 10/2005 | Yang et al. |
| 2006/0087036 A1 | 4/2006 | Yang |
| 2006/0091518 A1 | 5/2006 | Grafe et al. |
| 2006/0244142 A1 | 11/2006 | Waidhas et al. |
| 2007/0182029 A1 | 8/2007 | Franosch et al. |
| 2008/0029906 A1 | 2/2008 | Otremba |
| 2008/0142932 A1 | 6/2008 | Beer et al. |

FOREIGN PATENT DOCUMENTS

| | | |
|---|---|---|
| JP | 09-283697 | 10/1997 |
| JP | 2003-526208 | 9/2003 |
| JP | 2004/095836 | 3/2004 |
| JP | 2004-186688 | 7/2004 |
| JP | 2004-538641 | 12/2004 |
| JP | 2005-167191 | 6/2005 |
| JP | 2006-128597 | 5/2006 |
| JP | 2006-203079 | 8/2006 |
| TW | 200614392 | 5/2006 |
| TW | 200805595 | 1/2008 |

OTHER PUBLICATIONS

Japanese Notification of Reasons for Refusal mailed Oct. 8, 2013 in Japanese Patent Application No. 2010-214306.

Japanese Notification of Reasons for Refusal mailed Oct. 8, 2013 in Japanese Patent Application No. 2013-062791.

Taiwanese Office Action dated Mar. 18, 2014 in Taiwan Patent Application No. 100105917.

* cited by examiner (A)

(B)

(A)

(B)

(A-1)

(A-2)

(B-1)

(B-2)

(C-1)

(C-2)

(D-1)

(D-2)

(E-1)

(E-2)

(F-1)

(F-2)

(G-1)

(G-2)

(H-1)

(H-1)

(I-1)

(I-2)

(J-1)

(J-2)

SEMICONDUCTOR DEVICE AND MANUFACTURING METHOD THEREOF

CROSS-REFERENCE TO RELATED APPLICATIONS

This application is based upon and claims the benefit of priority from the prior Japanese Patent Application No. 2010-214306, filed on 24 Sep., 2010, the entire contents of which are incorporated herein by reference.

FIELD

The present invention is related to a semiconductor device, in particular, the present invention is related to a semiconductor device including a resin which seals a semiconductor element mounted on a support plate and a manufacturing method thereof.

BACKGROUND

After mounting individuated semiconductor elements on a support plate, an insulation layer is formed by coating an insulating resin on each semiconductor element and the support plate, and aperture parts are formed by removing the resin on electrode parts formed on the circuit surface of the semiconductor elements are used as a manufacturing method of a semiconductor device including a conventional resin sealing structure.

An example of this conventional semiconductor device manufacturing method is shown in Patent Document 1 (Japan Laid Open Patent 2005-167191). In patent document 1 an example is described whereby after attaching a plurality of individualized die to a base, the space between the plurality of die on the base is filled in with a first material layer comprised of an insulating resin etc., a second material layer is formed on the plurality of die and the first material layer, the second material layer is partially etched on electrode pads of the plurality of die and an aperture is formed.

However, with this manufacturing method, warpage in the support plate occurs to a difference in CTE (coefficient of thermal expansion) on the attachment surface between the support plate and semiconductor element due to thermal stress in the manufacturing process for coating an insulating resin, and the position accuracy of an aperture of a wire connection part subsequently formed on the insulating resin decreases. In addition, together with a reduction in size of semiconductor elements in recent years a high level of mounting accuracy is required when mounting individualized semiconductor elements on a support plate in order to form small apertures which exposes electrode parts on the circuit surface of the semiconductor elements, which leads to a reduction in the yield of semiconductor manufacture due to the difficulty in forming such apertures.

The present invention attempts to solve the problems described above, by providing a manufacturing method of a semiconductor device in which the positioning accuracy of an aperture is improved by reducing the influence of warpage on a support plate, a high level of mounting accuracy which is demanded when forming an aperture is not required and semiconductor manufacturing yield is improved.

SUMMARY

A semiconductor device related to one embodiment of the present invention includes a support plate, a semiconductor element mounted on the support plate and including a circuit element surface having a plurality of first electrodes, a first insulation layer covering the circuit element surface of the semiconductor element, and including a plurality of first apertures exposing the plurality of first electrodes, a second insulation layer covering an upper part of the support plate and each side part of the semiconductor element covered with the first insulation layer, and a wiring layer connected to upper parts of the first insulation layer and the second insulation layer and electrically connected to the plurality of first electrodes.

The semiconductor device related to one embodiment of the present invention may further include a third insulation layer formed on the wiring layer and including a plurality of second apertures exposing one or more parts of the wiring layer.

A method of manufacturing a semiconductor related to one embodiment of the present invention includes forming a plurality of semiconductor elements each having a circuit element surface including a plurality of first electrodes on a semiconductor substrate, forming a first insulation layer on the semiconductor substrate having the plurality of semiconductor elements, removing one or more parts of the first insulation layer and forming a plurality of first apertures exposing the plurality of first electrodes of the plurality of semiconductor elements, cutting the semiconductor substrate into the plurality of semiconductor elements, facing each circuit element surface of the plurality of semiconductor elements upwards and mounting the plurality of semiconductor elements on a support plate, forming a second insulation layer covering each side part of the plurality of semiconductor elements and the top of the support plate, and forming a wiring layer connected to upper parts of the first insulation layer and the second insulation layer and electrically connected to the plurality of first electrodes.

In addition, a method of manufacturing a semiconductor device related to one embodiment of the present invention may further include forming a third insulation layer on the wiring layer, removing one or more parts of the third insulation layer and forming a plurality of second apertures exposing a plurality of second electrodes which are one or more parts of the wiring layer, forming a plurality of external connection electrodes in the plurality of second apertures formed on the third insulation layer, the plurality of external connection electrodes being electrically connected to the plurality of second electrodes, and cutting the support plate into the plurality of semiconductor elements.

In addition, a stacked type semiconductor device related to one embodiment of the present invention includes a fourth insulation layer formed on the semiconductor device and including a plurality of third apertures exposing one or more parts of the wiring layer or the plurality of second electrodes, additional semiconductor device which is stacked on the semiconductor device across the fourth insulation layer, a plurality of conduction layers formed within the plurality of third apertures of the fourth insulation layer and which are electrically connected to the wiring layer of the semiconductor device or the plurality of second electrodes and the wire layer of the other semiconductor device, and a metal layer formed between the semiconductor device and the fourth insulation layer, and covering at least one part of an upper surface of the semiconductor device.

In addition, a stacked type semiconductor device related to one embodiment of the present invention may further includes a semiconductor device, a fourth insulation layer formed on the semiconductor device and including a plurality of third apertures exposing one or more parts of the wiring layer or the plurality of second electrodes, additional semiconductor device which is stacked on the semiconductor device across the fourth insulation layer, a plurality of conduction layers formed within the plurality of third apertures of the fourth insulation layer and which are electrically connected to the wiring layer of the semiconductor device or the plurality of second electrodes and the wire layer of the other semiconductor device.

According to the present invention, it is possible to reduce heat stress in a manufacturing process, reduce the effects of warpage of a support plate, and a high level of mounting accuracy of a semiconductor element for forming apertures is not required in a semiconductor device which includes a resin sealing structure, thereby, it is possible to improve the yield of the manufacturing process of the semiconductor device.

BRIEF DESCRIPTION OF DRAWINGS

FIG. 1 (B) is a plane view diagram of the line A-A' in FIG. 1;

FIG. 2 (B) is a cross sectional diagram of the line B-B' in FIG. 2;

FIG. 3 A (A-2) is a plane view diagram which shows a manufacturing process of a semiconductor device related to the present invention;

FIG. 3 B (B-1) is a cross sectional diagram which shows a manufacturing process of a semiconductor device related to the present invention;

FIG. 3 B (B-2) is a plane view diagram which shows a manufacturing process of a semiconductor device related to the present invention;

FIG. 3 C (C-1) is a cross sectional diagram which shows a manufacturing process of a semiconductor device related to the present invention;

FIG. 3 C (C-2) is a plane view diagram which shows a manufacturing process of a semiconductor device related to the present invention;

FIG. 3 D (D-1) is a cross sectional diagram which shows a manufacturing process of a semiconductor device related to the present invention;

FIG. 3 D (D-2) is a plane view diagram which shows a manufacturing process of a semiconductor device related to the present invention;

FIG. 3 E (E-1) is a cross sectional diagram which shows a manufacturing process of a semiconductor device related to the present invention;

FIG. 3 E (E-2) is a plane view diagram which shows a manufacturing process of a semiconductor device related to the present invention;

FIG. 3 F (F-1) is a cross sectional diagram which shows a manufacturing process of a semiconductor device related to the present invention;

FIG. 3 F (F-2) is a plane view diagram which shows a manufacturing process of a semiconductor device related to the present invention;

FIG. 3 G (G-1) is a cross sectional diagram which shows a manufacturing process of a semiconductor device related to the present invention;

FIG. 3 G (G-2) is a plane view diagram which shows a manufacturing process of a semiconductor device related to the present invention;

FIG. 3 H (H-1) is a cross sectional diagram which shows a manufacturing process of a semiconductor device related to the present invention;

FIG. 3 H (H-2) is a plane view diagram which shows a manufacturing process of a semiconductor device related to the present invention;

FIG. 3 I (I-1) is a cross sectional diagram which shows a manufacturing process of a semiconductor device related to the present invention;

FIG. 3 I (I-2) is a plane view diagram which shows a manufacturing process of a semiconductor device related to the present invention;

FIG. 3 J (J-1) is a cross sectional diagram which shows a manufacturing process of a semiconductor device related to the present invention;

FIG. 3 J (J-2) is a plane view diagram which shows a manufacturing process of a semiconductor device related to the present invention;

FIG. 5 (B) is a cross sectional diagram of a semiconductor device related to a fifth embodiment of the present invention; and FIG. 5 (C) is a cross sectional diagram of a semiconductor device related to a sixth embodiment of the present invention.

DESCRIPTION OF EMBODIMENTS

Figure 1:
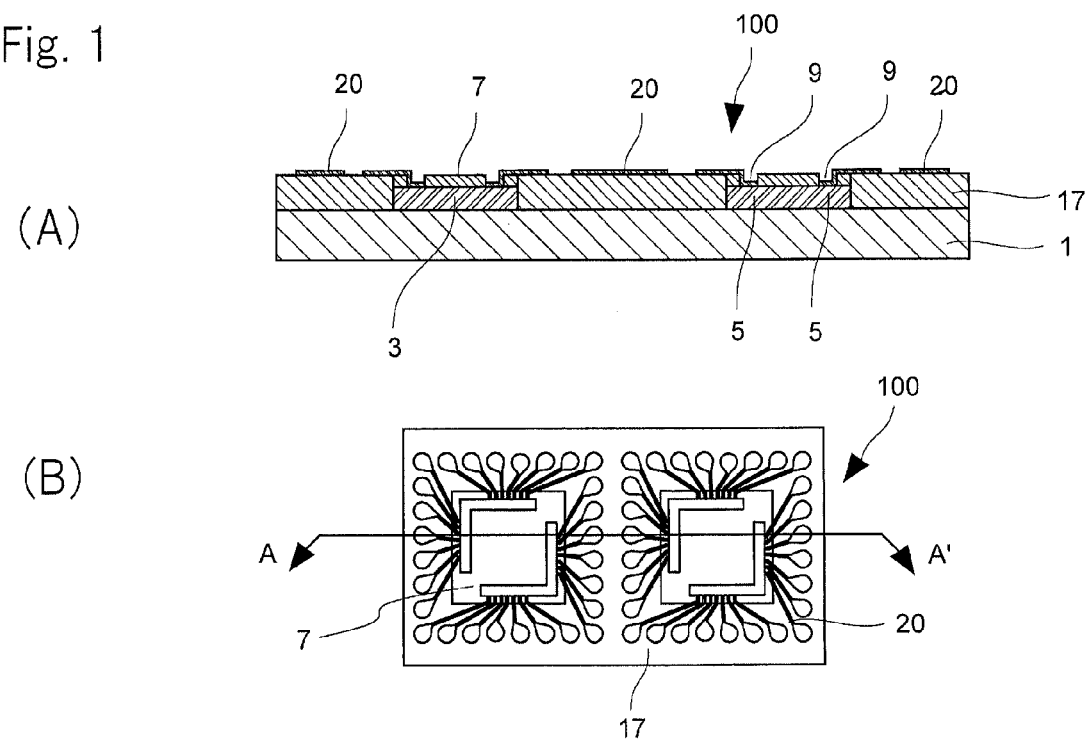
FIG. 1 (A) is a cross sectional diagram which shows a general structure of a semiconductor device related to a first embodiment of the present invention.

The embodiments of the present invention will be explained below while referring to the drawings. Furthermore, the same structural elements have the same reference numerals and overlapping explanations between embodiments are omitted.

(First Embodiment)

The semiconductor device related to the first embodiment of the present invention will be explained while referring to the diagrams.

[Structure of a Semiconductor Device]

FIG. 1 (A) and FIG. 1 (B) are diagrams which show a general structure of a semiconductor device related to the first embodiment of the present invention. FIG. 1 (B) is a plane view diagram which shows a general structure of a semiconductor device 100 and FIG. 1 (A) is a cross sectional diagram of the semiconductor device 100 seen from the line A-A' in FIG. 1 (B). In FIG. 1 (A) and FIG. 1 (B), the semiconductor device 100 includes a support plate 1, semiconductor elements 3 including a circuit element surface having a plurality of first electrodes 5, a first insulation layer 7 covering the circuit element surface of the semiconductor elements 3 and including a plurality of first apertures 9 exposing the plurality of first electrodes 5, a second insulation layer 17 covering the upper parts of the support plate 1 and side parts of the semiconductor elements 3 formed with the first insulation layer 7, and a wiring layer 20 which is formed in contact with the upper parts of the first insulation layer 7 and second insulation layer 17 and which is electrically connected to the plurality of first electrodes 5.

The support plate 1 of the semiconductor device 100 related to the first embodiment may be formed from a resin or metal. The shape and size of the support plate 1 is not particularly limited. For example, the support plate 1 may be rectangular or circle shaped. For example, an organic material such as resin, or a metal which can be planar processed (for example, SUS, Cu, Al etc.) can be used as the material of the support plate 1. However, glass or silicon may also be used.

The semiconductor element 3 of the semiconductor device 100 related to the first embodiment includes a circuit element surface on its surface. The semiconductor element 3 may have a thickness of about 50 μm for example, and equal to or less than 100 μm. The semiconductor element 3 is attached to the top of the support plate 1 by an adhesive (not shown in the diagram). For example, an epoxy group film or paste can be used as the adhesive material. However, other materials can be used for the adhesive as long as the semiconductor element 3 can be attached to the support plate 1.

An epoxy group resin or polyimide group resin can be used, for example, as the material of the first insulation layer 7 formed on the semiconductor element 3. However, the material is not limited to this and any material is sufficient as long as it includes insulation properties and can protect the circuit surface on the semiconductor element 3. The first insulation layer 7 has a thickness of about 5 μm to 20 μm and is preferably 10 μm. A thickness of 20 μm or more is possible if apertures can be formed in the insulation layer 7. However, the thickness of the first insulation layer 7 is usually 30 μm or less.

The relationship between the height of the second insulation layer 17 formed on the support plate 1 and between the semiconductor elements 3 and the height of the first insulation layer 7 is not particularly limited here. The material given as an example of the material of the first insulation layer 7 may be used as the material of the second insulation layer 17. In addition, the second insulation layer 17 may be formed from the same or different material as the first insulation layer 7.

The wiring layer 20 is electrically connected to the plurality of first electrodes 5 which are formed on the semiconductor element 3. For example, Cu or Ag can be used as the material of the wiring layer. However, the material is not limited to Cu or Ag and any material can be used as long as it has conductive properties. In addition, the structure of the wiring formed on the semiconductor element 3 is not limited to the structure shown in FIG. 1 (B). For example, a plurality of wires may be connected to a ball land which is a common external connection terminal formed on the semiconductor element 3.

According to the first embodiment of the present invention, because a process for forming the first insulation layer 7 on semiconductor elements is not performed on the support plate, when compared to the conventional manufacturing method forming the first and second insulation layers on the support plate, because the effects of thermal stress generated by the formation process of the first insulation layer are not received and the effects of warpage of the support plate in the process are reduced, it is possible to form the apertures with a high level of accuracy. Consequently, it is possible to more densely pack electrode parts on the semiconductor element and increase the number of connection pins. Furthermore, according to the first embodiment of the present invention, by manufacturing the first insulation layer 7 on the semiconductor elements 3 and second insulation layer 17 between a plurality of semiconductor elements 3 in separate processes and controlling the height of each insulation layer it is possible to protect wire breaks due to differences in height between mutual insulation layers, and it is possible to manufacture a wiring layer 20 with connection reliability.

(Second Embodiment)

A semiconductor device 200 related to the second embodiment of the present invention will be explained while referring to the diagrams. The second embodiment explains an example wherein a third insulation layer 27 which further includes a plurality of second apertures 19 are formed on the semiconductor device 100 related to the first embodiment.

Figure 2:
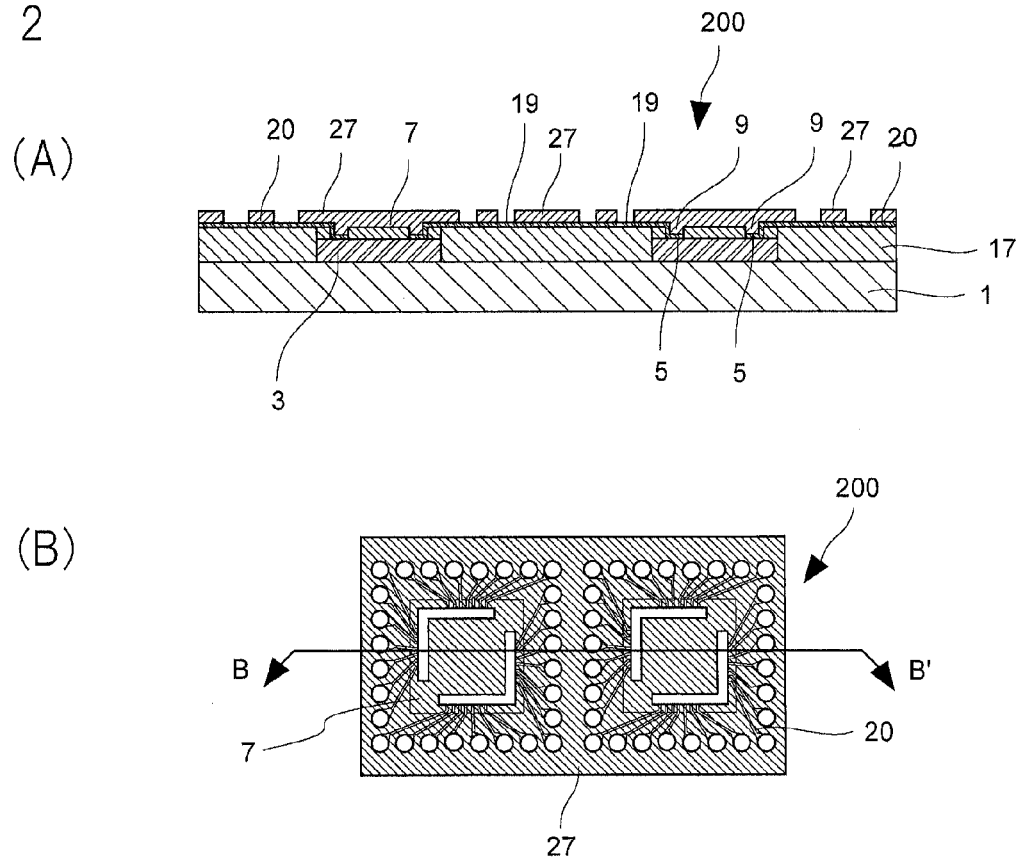
FIG. 2 (A) is a plane view diagram which shows a general structure of a semiconductor device related to a second embodiment of the present invention.

FIG. 2 is a cross sectional diagram which shows a general structure of the semiconductor device 200 related to the second embodiment. Furthermore, in the semiconductor device 200 related to the second embodiment, a third insulation layer 27 including a plurality of second apertures 19 are formed, and because the remaining structure is the same as the structure explained in the first embodiment, therefore an explanation is omitted here.

As is shown in FIG. 2 (A), in the semiconductor device 200 related to the second embodiment, a third insulation layer 27 including a plurality of second apertures 19 are formed on the wiring layer 20. The material given as an example of the material of the first insulation layer 7 may be used as the material of the third insulation layer 27. In addition, the third insulation layer 27 may be the same as the first insulation layer 7 or the second insulation layer 17, one part only may be the same and a different material may be used for each layer.

The remaining structure and manufacturing method is the same as the first embodiment. According to the second embodiment of the present invention, it is possible to secure an external electrode as well as the wiring layer 20 being protected by the third insulation layer 27, and it is possible to obtain a connection between the semiconductor device and an external device.

(Third Embodiment)

A semiconductor device 300 related to the third embodiment of the present invention will be explained while referring to the diagrams. The third embodiment explains an example wherein external connection electrodes 30 are formed on the third insulation layer 27 including a plurality of second apertures 19 exposing second electrodes 15 in the semiconductor device 200 related to the second embodiment, and each semiconductor device 300 is individualized.

FIG. 3 J (J-1) and FIG. 3 J (J-2) are cross sectional and plane view diagrams which shows general structures of the semiconductor device 300 related to the third embodiment. Furthermore, in the semiconductor device 300 related to the third embodiment, external connection electrodes 30 are formed on the third insulation layer 27 including a plurality of second apertures exposing the second electrodes and each semiconductor device is individualized in the semiconductor device 200 related to the second embodiment. Because the remaining structure is the same as the structure explained in the second embodiment, therefore an explanation is omitted here.

Figure 3A:
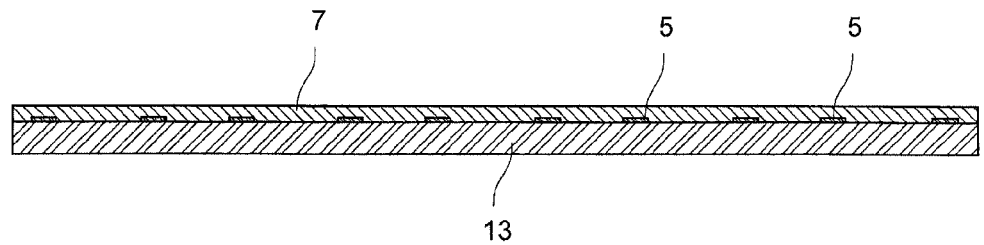
FIG. 3 A (A-1) is a cross sectional diagram which shows a manufacturing process of a semiconductor device related to the present invention.
Figure 3A:
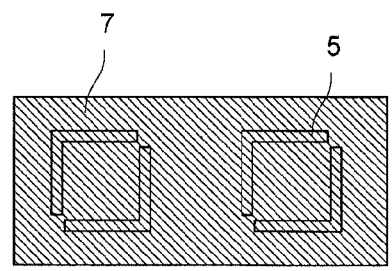
Figure 3B:
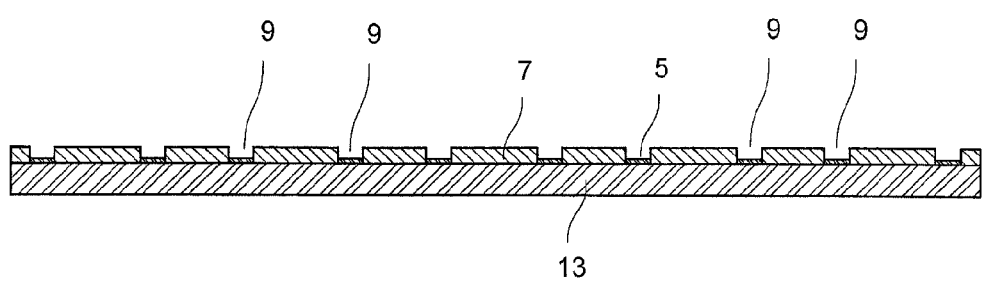
Figure 3B:
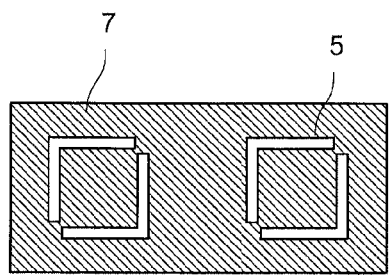
Figure 3C:
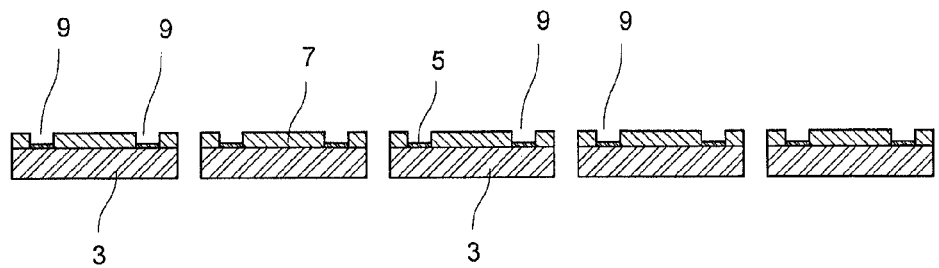
Figure 3C:
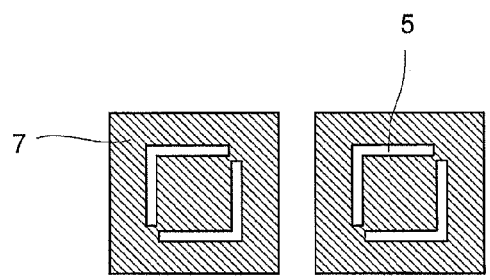
Figure 3D:
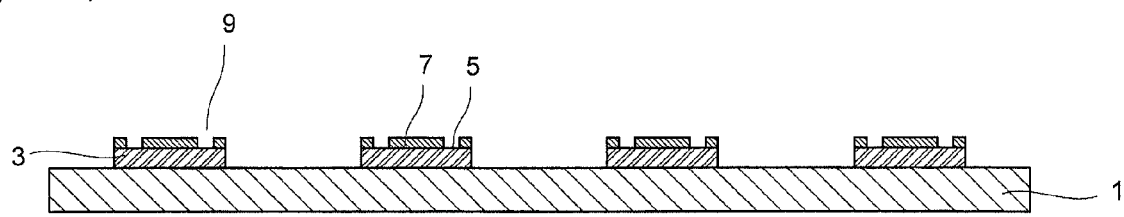
Figure 3D:
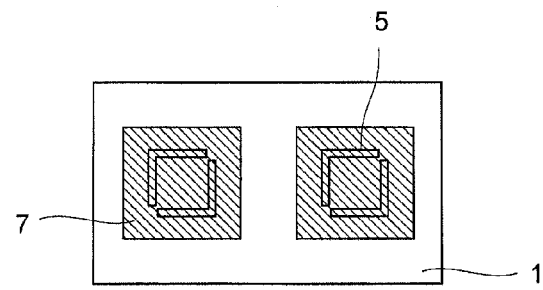
Figure 3E:
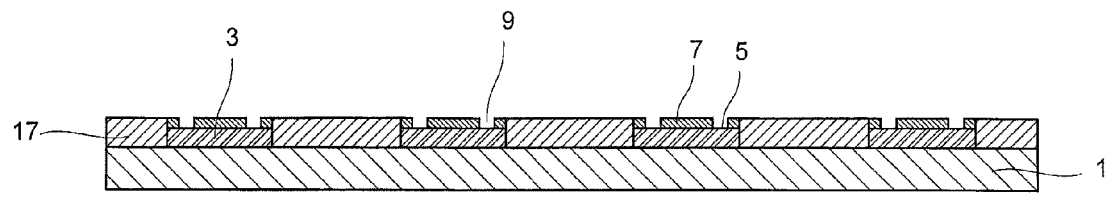
Figure 3E:
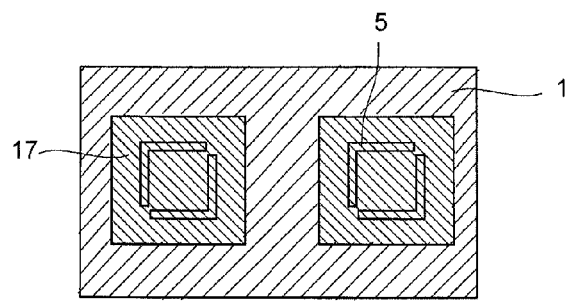
Figure 3F:
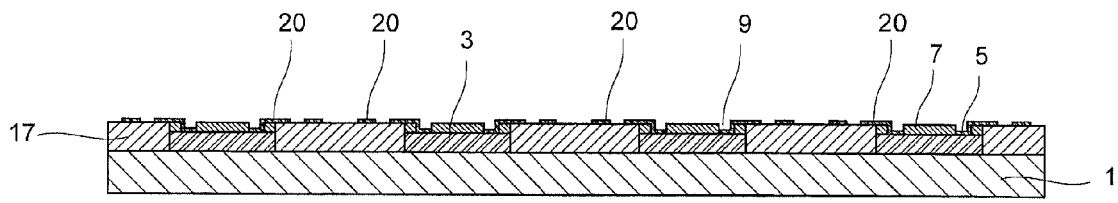
Figure 3F:
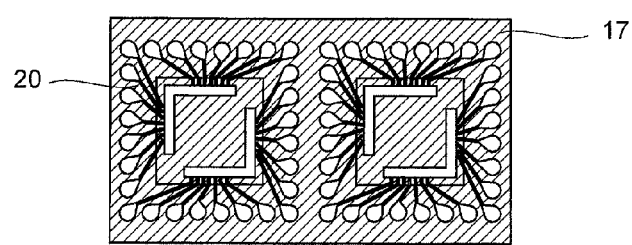
Figure 3G:
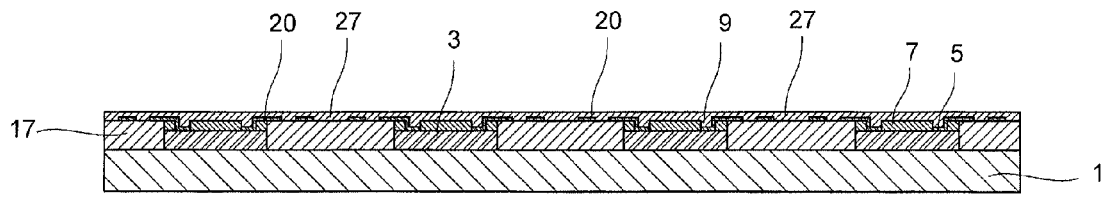
Figure 3G:
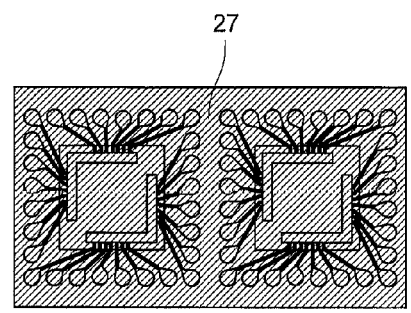
Figure 3H:
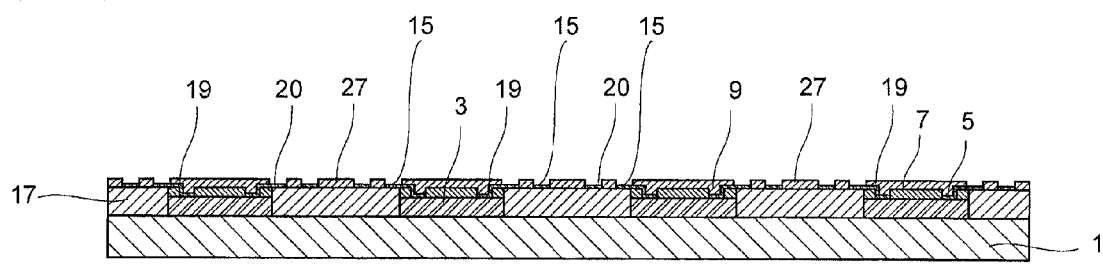
Figure 3H:
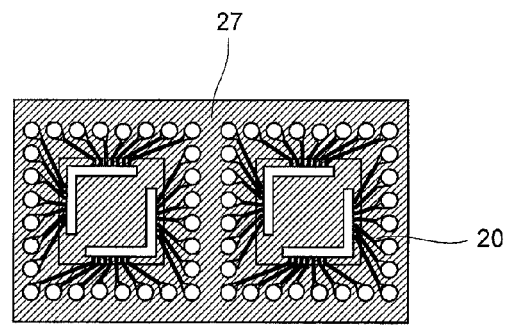
Figure 3I:
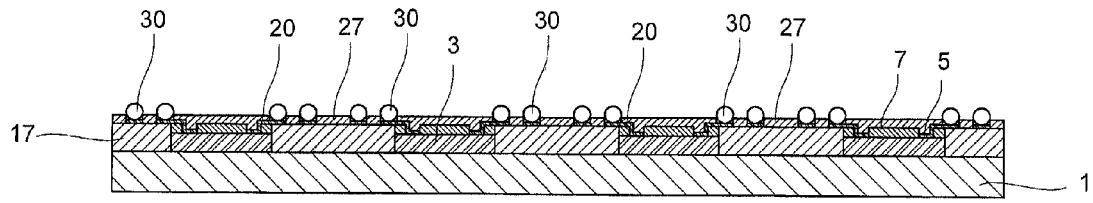
Figure 3I:
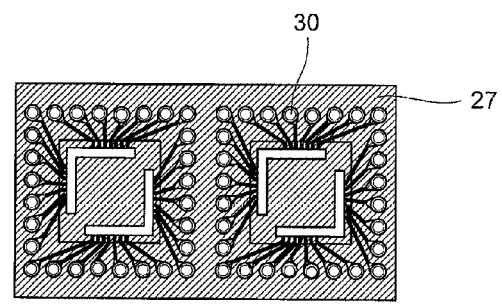
Figure 3J:
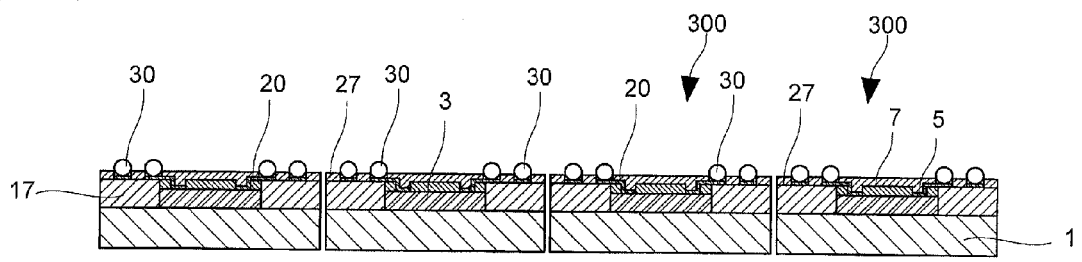
Figure 3J:
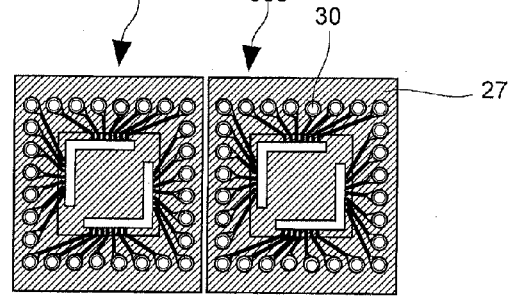

As is shown in FIG. 3 J (J-1), in the semiconductor device 300 related to the third embodiment, external connection electrodes 30 are formed on the third insulation layer 27 including a plurality of second apertures 19 exposing the second electrodes 15 (see FIG. 3H (H-1) the semiconductor device 200 related to the second embodiment and each semiconductor device 300 is individualized. The material of the external connection electrodes 30 may be a solder ball as shown in FIG. 3 I (I-1) and FIG. 3 I (I-2). However, the material is not limited to this. For example, other shapes and material may be used as long as the structure is conductive and is electrically connected to the second electrodes 15.

(Manufacturing Method of a Semiconductor Device)

A manufacturing method of the third semiconductor device 300 related to the third embodiment will be explained while referring to the diagrams. Each manufacturing process of the semiconductor device 300 related to the third embodiment is shown in FIG. 3 A (A-1) to FIG. 3 J (J-2). Furthermore, because the semiconductor device 100 and semiconductor device 200 related to the first embodiment and second embodiment of the present invention are manufactured in the process of manufacturing the semiconductor device 300 related to the third embodiment, the manufacturing method of the semiconductor devices related to the first and second embodiments will also be explained here.

First, as is shown in FIG. 3A (A-1), the first insulation layer 7 comprised from a resin etc. is coated on the entire surface of a semiconductor substrate 13 (semiconductor wafer) having a semiconductor circuit comprised from silicon or a compound semiconductor and a plurality of first electrodes 5. For example, a spin coat method, printing method, inkjet method or dispense method can be used to coat the resin. However, the coating method is not limited to these methods. Other coating methods can be used as long as the first insulation layer 7 can be controlled to have a fixed thickness. Next, as is shown in FIG. 3 B (B-1), a plurality of first apertures 9 are formed by removing only the upper parts of the plurality of first electrodes 5 among the first insulation layers 7 which are coated on the upper surface of the semiconductor substrate 13. As a method of forming the first insulation layer 7 including the first apertures 9, for example, after coating a photo sensitive resin on the entire upper surface of the semiconductor substrate 13 including the plurality of first electrodes 5, the top of the plurality of first electrodes 5 are partially exposed using photolithography and apertures are formed. A method for forming the plurality of first apertures 9 after forming the first insulation layer 7 on the entire upper surface of the semiconductor substrate 13 is not limited to photolithography. Other methods can be used as long as it is possible to form the apertures on the first insulation layer 7.

Firstly, after coating the first insulation layer 7 on the entire upper surface of the semiconductor substrate 13 including the plurality of first electrodes 5, a manufacturing process for forming the plurality of first apertures 9 exposing the first electrodes 5 after coating the first insulation layer 7 on the entire upper surface of the semiconductor substrate 13 including the plurality of first electrodes 5 is shown in FIG. 3 A (A-1) and FIG. 3 B (B-1). However, a method of forming the first insulation layer 7 which includes the plurality of first apertures 9 is not limited to this method. For example, when forming the first insulation layer 7 on the semiconductor substrate 13, coating in advance the first insulation layer 7 comprised of a resin only on the upper surface of the semiconductor substrate 13 except the upper part of the plurality of first electrodes 5, then, post baking the resin which is coated on the upper surface of the semiconductor substrate 13 except the upper part of the plurality of first electrodes 5, and forming the first insulation layer 7 including the plurality of apertures 9 on the plurality of first electrodes 5, is also possible as an alternative method of forming the first apertures 9.

As is shown in FIG. 3 C (C-1) and FIG. 3 C (C-2), after forming the first insulation layer 7 which includes the plurality of the first apertures 9 on the semiconductor substrate 13, the semiconductor substrate 13 is individualized using a dicer or slicer for each semiconductor element 3.

Next, as is shown in FIG. 3 D (D-1) and FIG. 3 D (D-2), the individualized semiconductor elements 3 are mounted on the support plate 1. The individualized semiconductor elements 3 are fixed at almost equal intervals to the support plate 1 using an adhesive etc.

In addition, as is shown in FIG. 3 E (E-1) and FIG. 3 E (E-2), the space between the plurality of semiconductor elements 3 mounted on the support plate 1 is filled in, and the second insulation layer 17 covering the upper surface of the support plate 1 is formed. For example, a spin coat method, printing method, inkjet method or dispense method can be used as the method of forming the second insulation 17. However, the formation method is not limited to these. For example, other coating methods can be used as long as the second insulation layer 17 can be controlled to have a fixed thickness. In addition, the manufacturing method of the second insulation layer 17 may be the same as or different from the manufacturing method of the first insulation layer 7.

Furthermore, as is shown in FIG. 3 F (F-1) and FIG. 3 F (F-2), the wiring layer 20 is formed on the first insulation layer 7 and second insulation layer 17 and also on the plurality of first electrodes 5. The wiring layer 20 may be formed, for example, by plating, printing or an inkjet method. The wiring layer 20 is electrically connected with the plurality of first electrodes 5 on the semiconductor element 3. The semiconductor device 100 related to the first embodiment is formed using the manufacturing process described above.

Next, as is shown in FIG. 3 G (G-1) and FIG. 3 G (G-2), the third insulation layer 27 comprised from a resin is coated on the entire upper surface of the support plate 1 including the top of the wiring layer 20. For example, a spin coat method, printing method, inkjet method or dispense method can be used as the method of forming the third insulation 27. However, the method of forming the third insulation layer 27 is not limited to these. For example, other coating methods can be used as long as the third insulation layer 27 can be controlled to have a fixed thickness. As is shown in FIG. 3H (H-1), the plurality of second apertures 19 are formed by removing only the upper parts of the plurality of second electrodes 15 which form a part of the wiring layer 20, among the third insulation layers 27 which are coated on the upper surface of the support plate 1 including the wiring layer 20. As a method of forming the third insulation layer 27 including the second apertures 19, for example, after coating a photo sensitive resin on the entire upper surface of the support plate 1 including the plurality of second electrodes 15, the top of the plurality of second electrodes 15 are partially exposed using photolithography and apertures are formed. A method for forming the plurality of second apertures 19 after forming the second insulation layer 27 on the entire upper surface of the support plate 1 including the wiring layer 20 is not limited to photolithography. Other methods can be used as long as it is possible to form the apertures on the third insulation layer 27. The semiconductor device 200 related to the second embodiment is formed by the manufacturing process described above.

Next, as is shown in FIG. 3 I (I-1) and FIG. 3 I (I-2), an external connection electrodes 30 may be respectively formed on the plurality of second electrodes 15 which are exposed by the plurality of second apertures 19 on the third insulation layer 27. The external connection electrodes 30 may be a solder ball as shown in FIG. 3 I (I-1) and FIG. 3 I (I-2). However, the shape of and material of the external connection electrodes 30 are not limited to this. For example, other shapes and materials can be used as long as it includes a conductive structure and is electrically connected to the second electrodes 15. The external connection electrodes 30 may be formed on the second insulation layer 17 using a welding method, a plating method or printing method.

Next, as is shown in FIG. 3 J (J-1) and FIG. 3 J (J-2), each of the plurality of semiconductor elements 3 formed at once on the support plate 1 are cut using a dicer or slicer, and each semiconductor device is manufactured. The interval where each semiconductor elements 3 are cut is generally from 0.1 mm to 0.5 mm but not limited to this. In this way, the semiconductor device 300 related to the third embodiment is manufactured.

(Fourth Embodiment)

A semiconductor device 400 related to the fourth embodiment of the present invention will be explained while referring to the diagrams. The fourth embodiment of the present invention explains an example of a structure wherein an external connection electrodes 40 are comprised of conductive structures in the semiconductor device 300 related to the third embodiment.

Figure 4:
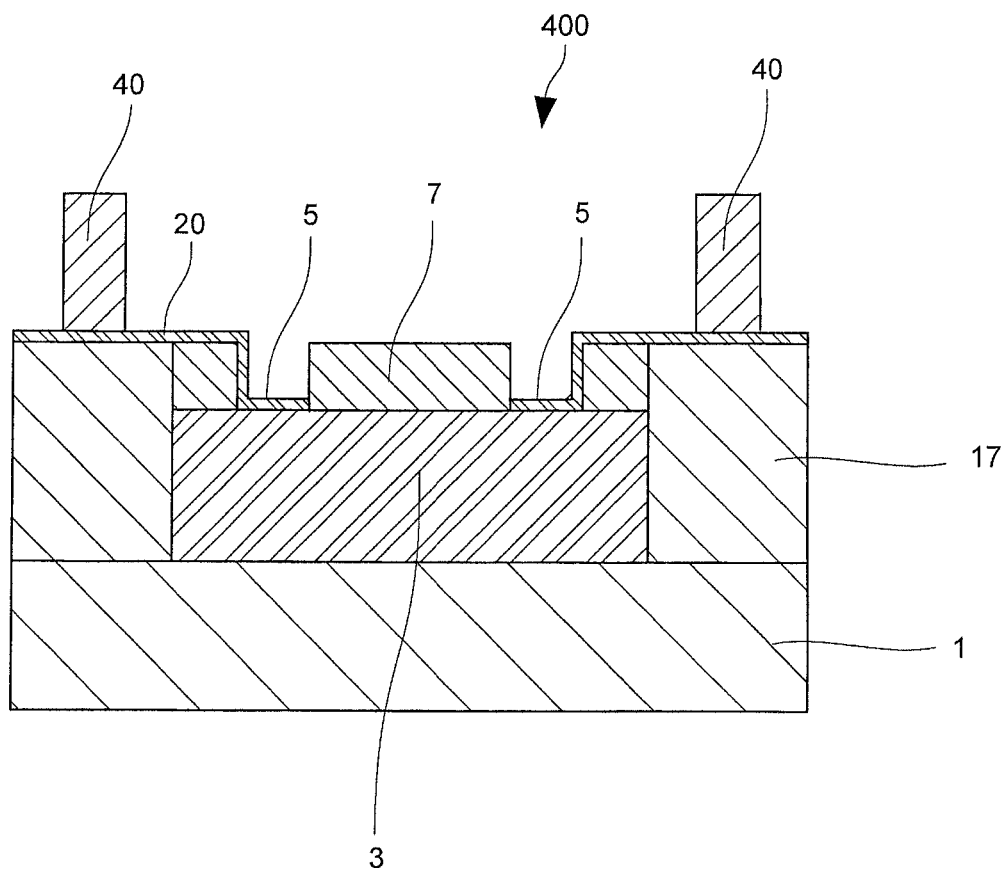
FIG. 4 is a cross sectional diagram which shows a general structure of a semiconductor device related to a third embodiment of the present invention.

FIG. 4 is a cross sectional diagram which shows a general structure of a semiconductor device 400 related to the fourth embodiment. Furthermore, in the semiconductor device 400 related to the fourth embodiment, the external connection electrodes 40 are comprised of conductive structures. Because the remaining structure is the same as the structure explained in the third embodiment, therefore an explanation is omitted here.

As is shown in FIG. 4, in the semiconductor device 400 related to the fourth embodiment, the external connection electrodes 40 are comprised of conductive structures. The shape of the external connection electrodes 40 which are arranged on the semiconductor device 400 related to the present invention is not limited to solder balls 30 as shown in FIG. 3 I and FIG. 3 H. The external connection electrodes 40 may also have a round shape as shown in FIG. 4. In addition, the external connection electrodes 40 may also have a column shape, a globe shape, a projection shape or needle shape. Furthermore, the external connection electrodes 40 may be arranged on an upper part of the wiring layer 20 as shown in FIG. 4 as long as the external connection electrodes 40 are electrically connected to the second electrodes 15 forming a part of the wiring layer 20.

According to the fourth embodiment of the present invention, it is possible to obtain a semiconductor device with an improved electrical connection between electrodes by using a conductive structures as the external connection electrodes 40.

(Fifth Embodiment)

A semiconductor device 500 related to the fifth embodiment of the present invention will be explained while referring to the diagrams. In the fifth embodiment, a semiconductor device 500 is explained having a multi-chip structure in which a plurality of semiconductor elements can be mounted by arranging a plurality of the semiconductor devices related to the first to fourth embodiments in parallel.

Figure 5:
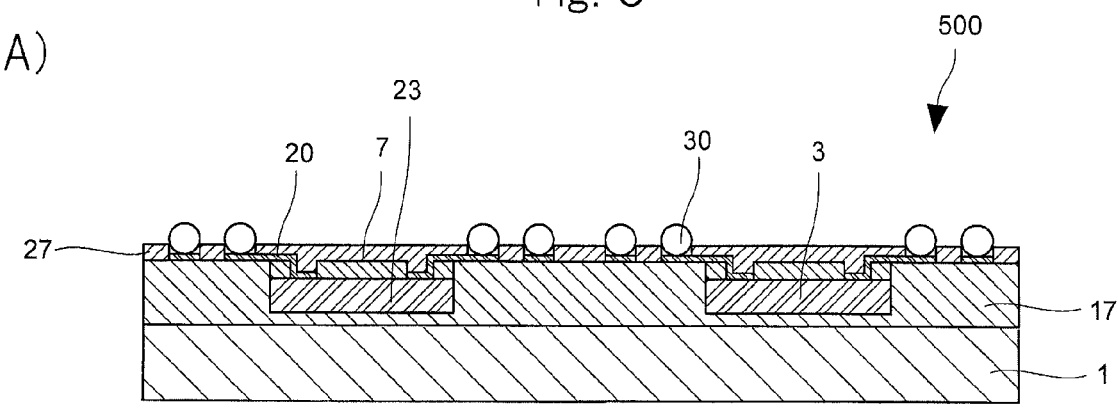
FIG. 5 (A) is a cross sectional diagram of a semiconductor device related to a fourth embodiment of the present invention.
Figure 5:
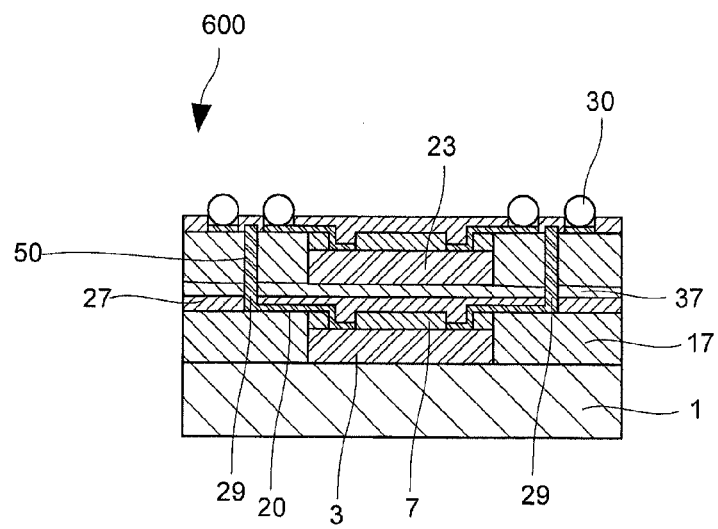
Figure 5:
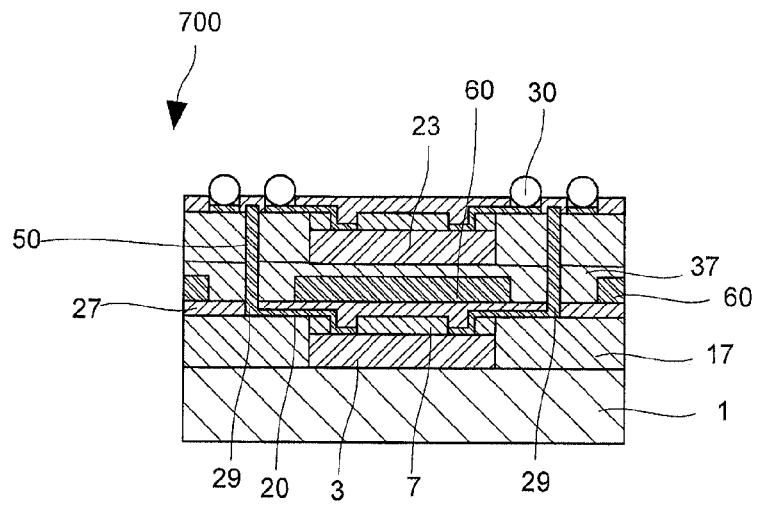

FIG. 5 (A) is a diagram which shows a general structure of the semiconductor device 500 related to the fifth embodiment. Furthermore, in the semiconductor device 500 related to the fifth embodiment, a plurality of the semiconductor devices related to the first to fourth embodiments are arranged in parallel. Because the remaining structure is the same as the structure explained in the first to fourth embodiments, therefore an explanation of the remaining structure and manufacturing method of the semiconductor device is omitted here.

As is shown in FIG. 5 (A), at least one semiconductor element 3 is mounted on the semiconductor device related to the fifth embodiment. An example of mounting an additional semiconductor device 23 in parallel to the semiconductor element 3 is shown in FIG. 5 (A). However, the structure of the semiconductor device related to the fifth embodiment is not limited to this. For example, instead of an additional semiconductor device 23, a structure including electrical components or electrodes other than a semiconductor element may be formed.

According to the fifth embodiment of the present invention, it is possible to obtain a semiconductor device having a multi-chip structure by arranging a plurality of components in parallel.

(Sixth Embodiment)

A stacked semiconductor device 600 related to the sixth embodiment of the present invention will be explained while referring to the diagrams. The sixth embodiment explains a stacked type semiconductor device which has a three dimensional structure which can be mounted with a plurality of semiconductor elements by arranging and stacking a plurality of semiconductor devices related to the first to fourth embodiments. Furthermore, the stacked type semiconductor device 600 related to the sixth embodiment has a three dimensional structure which can be mounted with a plurality of semiconductor elements by arranging and stacking a plurality of semiconductor devices related to the first to fourth embodiments. Because the remaining structure is the same as the structure explained in the first to fourth embodiments, therefore an explanation of the remaining structure and manufacturing method of the semiconductor device 600 is omitted here.

As is shown in FIG. 5 (B), at least one semiconductor element 3 is mounted on the stacked type semiconductor device 600 related to the sixth embodiment. The stacking structure is explained below in detail. First, a fourth insulation layer 37 is formed on the semiconductor device 100 related to the first embodiment and a plurality of third apertures 29 exposing the second electrodes 15 or another part of wiring layer 20 are formed on the fourth insulation layer 37. Furthermore, as a method of manufacturing the fourth insulation layer 37 including the plurality of third apertures 29, after coating in advance the fourth insulation layer 37 comprised of a resin on only the parts other than the third apertures 29, the fourth insulation layer 37 may be post baked and formed including the plurality of third apertures 29, the same as the first insulation layer 7 and third insulation layer 27, or after coating the material of the fourth insulation layer 37 on the entire upper surface of the semiconductor device including the third apertures 29, only the fourth insulation layer 37 is removed on the third apertures 29 and the plurality of third apertures 29 are formed. In addition, the material given as an example of the material of the first to third insulation layers may be used as material for the fourth insulation layer 37. Furthermore, each material of the first to fourth insulation layers may all be the same, one part may be the same or each material may be different.

Next, an additional semiconductor device 23 is mounted on the fourth insulation layer 37, a conduction layer 50 which is electrically connected to the second electrodes 15 or different parts of the wiring layer 20 is formed within the third apertures 29, and the conduction layer 50 is electrically connected to an electrode on an additional semiconductor device. In addition, the space between the additional semiconductor device 23 and the fourth insulation layer 37 is resin sealed. For example, a plating method such as through hole plating may be used as method of manufacturing the conduction layer 50.

An example whereby an additional semiconductor device 23 is stacked on the semiconductor element 3 is shown in FIG. 5 (B). However, the structure of the stacked type semiconductor device related to the sixth embodiment is not limited to this. For example, electrical components other than a semiconductor element may be stacked instead of the additional semiconductor device 23.

According to the sixth embodiment, it is possible to obtain semiconductor device having a stacked structure by stacking a plurality of components and reduce the mounting area.

(Seventh Embodiment)

A stacked semiconductor device 700 related to the seventh embodiment of the present invention will be explained while referring to the diagrams. The seventh embodiment explains an example in which the stacked type semiconductor device related to the sixth embodiment is arranged with a metal layer 60 between the semiconductor element 3 and the forth insulation layer 37. Furthermore, the stacked type semiconductor device 700 related to the seventh embodiment is arranged with a metal layer 60 between the semiconductor element 3 and the forth insulation layer 37. Because the remaining structure is the same as the structure explained in the sixth embodiment, therefore an explanation of the remaining structure and manufacturing method of the semiconductor device 700 is omitted here.

As is shown in FIG. 5 (C), at least one semiconductor element 3 is mounted on the stacked type semiconductor device 700 related to the seventh embodiment. The stacking structure is explained below in detail. First, a fourth insulation layer 37 is formed on the semiconductor device 100 related to the first embodiment and a plurality of third apertures 29 exposing the second electrodes 15 or another parts of wiring layer 20 are formed on the fourth insulation layer 37 which is the same as in the sixth embodiment.

Next, a metal layer 60 is formed to cover at least one part of the upper surface of the semiconductor device 3. An additional semiconductor device 23 is mounted above this, and a conduction layer 50 which is electrically connected to the second electrodes 15 or another part of the wiring layer 20 is formed within the third apertures 29. The conduction layer 50 is electrically connected to electrodes on an additional semiconductor device 23. In addition, the upper surface of the other semiconductor device 13, and the space between the metal layer 60 and the fourth insulation layer are resin sealed.

An example in which additional semiconductor device 23 is mounted on the semiconductor element 3 across the metal layer 60 is shown in FIG. 5 (C). However, the structure of the stacked type semiconductor device related to the seventh embodiment is not limited to this structure. For example, electrical components apart from a semiconductor element may be stacked instead of the additional semiconductor device 23.

According to the seventh embodiment of the present invention, it is possible to obtain a semiconductor device having a stacked structure by stacking a plurality of components. Furthermore, because it is possible to effectively discharge heat generated from the semiconductor element 3 arranging the metal layer 60 with a sealing resin, it is possible to obtain a stacked type semiconductor device having excellent heat dissipation properties. In addition, forming the metal layer 60 so that it is electrically connected with any electrodes which are connected to a semiconductor device it is possible to provide a ground function to the metal layer 60 and obtain a semiconductor device having noise protection effects.

(Eighth Embodiment)

In the semiconductor device related to eighth embodiment of the present invention, the height of the second insulation layer may be the same or less than the height of the first insulation layer.

In addition, in the manufacturing method of the semiconductor device related to eighth embodiment of the present invention, the height of the second insulation layer may be the same or less than the height of the first insulation layer.

The invention claimed is:

1. A semiconductor device comprising:
a support plate;
a semiconductor element mounted on the support plate and including a circuit element surface having a plurality of first electrodes;
a first insulation layer covering at least a portion of an upper part of the circuit element surface of the semiconductor element but not covering side parts of the semiconductor element, and including a plurality of first apertures exposing the plurality of first electrodes;
a second insulation layer covering at least a portion of an upper part of the support plate, side parts of the semiconductor element and side parts of the first insulation layer, the first insulation layer not being formed on an upper part of the second insulation layer; and
wirings formed on an upper part of the first insulation layer and on an upper part of the second insulation layer, and electrically connected to the corresponding first electrodes.

2. The semiconductor device according to claim 1, further comprising:
a third insulation layer formed on the wirings and including a plurality of second apertures partially exposing the wirings wherein a plurality of second electrodes are formed.

3. The semiconductor device according to claim 2, wherein a height of the second insulation layer is the same or less than a height of the first insulation layer.

4. The semiconductor device according to claim 1, wherein a height of the second insulation layer is the same or less than a height of the first insulation layer.

5. A stacked type semiconductor device comprising:
a support plate;
a first semiconductor element mounted on the support plate and including a circuit element surface having a plurality of first electrodes;
a first insulation layer covering the circuit element surface of the first semiconductor element, and including a plurality of first apertures exposing the plurality of first electrodes;
a second insulation layer covering an upper part of the support plate and side parts of the first semiconductor element and side parts of the first insulation layer;
wirings formed on an upper part of the first insulation layer and on an upper part of the second insulation layer, and electrically connected to the corresponding first electrodes;
a third insulation layer formed above the semiconductor device and including a plurality of second apertures partially exposing the wirings;
a second semiconductor element stacked on the semiconductor device with the third insulation layer interposed between the second semiconductor element and the semiconductor device;
a fourth insulation layer covering the circuit element surface of the second semiconductor element, and including a plurality of third apertures exposing a plurality of second electrodes;
a fifth insulation layer covering an upper part of the third insulation layer and side parts of the second semiconductor element, and including a plurality of fourth apertures above the second apertures;
a plurality of conduction layers formed within the plurality of second apertures of the third insulation layer and being electrically connected to the wirings of the semiconductor device and to a wiring of the second semiconductor element; and a metal layer formed between the semiconductor device and the third insulation layer, and partially covering an upper surface of the semiconductor device.

6. The stacked type semiconductor device according to claim 5, wherein a height of the second insulation layer is the same or less than a height of the first insulation layer.

7. A stacked type semiconductor device comprising:
a support plate;
a first semiconductor element mounted on the support plate and including a circuit element surface having a plurality of first electrodes;
a first insulation layer covering the circuit element surface of the first semiconductor element, and including a plurality of first apertures exposing the plurality of first electrodes;
a second insulation layer covering an upper part of the support plate and side parts of the first semiconductor element and side parts of the first insulation layer;
wirings formed on an upper part of the first insulation layer and on an upper part of the second insulation layer, and electrically connected to the corresponding first electrodes;
a third insulation layer formed above the semiconductor device and including a plurality of second apertures partially exposing the wirings;
a metal layer formed partially on the third insulation layer, except for the second apertures;
a fourth insulation layer formed above the metal layer and including a plurality of third apertures partially exposing the metal layer, and also above the second apertures;
a second semiconductor element stacked on the semiconductor device with the fourth insulation layer interposed between the semiconductor device and the second semiconductor element;
a fifth insulation layer covering the circuit element surface of the second semiconductor element, and including a plurality of fourth apertures exposing a plurality of second electrodes;
a sixth insulation layer covering an upper part of the third insulation layer and side parts of the second semiconductor element, and including a plurality of fifth apertures above the second and third apertures;
a plurality of conduction poles formed within the plurality of second, fifth and third apertures of the third, sixth and fourth insulation layers, respectively, and being electrically connected to the wirings of the semiconductor device and the metal layer; and
second wirings formed on an upper part of the fifth insulation layer and on an upper part of the sixth insulation layer and electrically connected to the second electrodes and the plurality of conduction poles, and some wirings connect between the second electrodes and the plurality of conduction poles.

8. The stacked type semiconductor device according to claim 7, wherein a height of the second insulation layer is the same or less than a height of the first insulation layer.

* * * * *